United States Patent [19]

Fujii

[11] 4,262,246

[45] Apr. 14, 1981

[54] STANDING WAVE RATIO DETECTING APPARATUS

[75] Inventor: Tadaaki Fujii, Katsuta, Japan

[73] Assignee: Hitachi, Ltd., Japan

[21] Appl. No.: 5,235

[22] Filed: Jan. 22, 1979

[30] Foreign Application Priority Data

Jan. 20, 1978 [JP] Japan .............................. 53-4569[U]

[51] Int. Cl.³ .................. G01R 27/02; H04B 17/00
[52] U.S. Cl. ............................. 324/58 R; 324/58 A; 324/58 B; 455/115
[58] Field of Search ............... 324/58 R, 58 A, 58 B, 324/57 R, 95; 364/606, 850; 325/67, 133; 328/161; 455/67, 115

[56] References Cited

U.S. PATENT DOCUMENTS

| 3,789,197 | 1/1974 | Games | 364/850 |
| 4,041,395 | 8/1977 | Hill | 325/133 |

Primary Examiner—Ernest F. Karlsen
Attorney, Agent, or Firm—Craig and Antonelli

[57] ABSTRACT

A standing wave ratio detecting apparatus comprising a first comparator for comparing a traveling wave detection signal with a sawtooth or triangular wave signal having an amplitude proportional to the traveling wave detection signal to generate a first pulse signal, a generator receiving the first pulse signal to generate the sawtooth or triangular wave signal, a second comparator for comparing the sawtooth or triangular wave signal with a reflected wave detection signal to generate a second pulse signal having a duty cycle representative of the standing wave ratio and a meter device for averaging out the second pulse signal and indicating the averaged value. By this construction determination of the standing wave ratio is facilitated without troublesome operation.

5 Claims, 6 Drawing Figures

STANDING WAVE RATIO DETECTING APPARATUS

BACKGROUND OF THE INVENTION

1. Field of the Invention

The present invention relates to an apparatus for detecting the standing wave ratio representing the degree of matching between a transmitter and an antenna or the like.

2. Description of the Prior Art

A circuit diagram of a generally-used conventional apparatus for detecting the standing wave ratio is shown in FIG. 1. In this drawing, reference numeral 1 shows a transmitter, numeral 2 a load (antenna), and numeral 3 a directional coupler for coupling the transmitter 1 with the load 2. The coupler 3 includes a conductor section 31 for conducting an output signal of the transmitter 1 to the load 2, a traveling wave detecting conductor section 32 provided in parallel to the conductor section 31 for detecting the traveling wave F of the signal passing through the conductor section 31, and a reflected wave detecting conductor section 33 provided in parallel to the conductor section 31 for detecting a reflected wave R of the signal generated from the load 2 to the transmitter 1 by the impedance mismatching between the transmitter 1 and the load 2. An end of each of the conductor sections 32 and 33 is grounded through a common resistor 34. Numeral 4 shows a traveling wave detector circuit connected to the other end of the traveling wave detecting conductor section 32 of the coupler 3 for detecting the traveling wave F detected by the conductor section 32, thus producing a traveling wave detected DC voltage $V_F$. Numeral 5 shows a reflected wave detector circuit connected to the other end of the reflected wave detecting conductor section 33 of the coupler 3 for detecting the reflected wave F detected by the conductor section 32, thus producing a reflected wave detected DC voltage $V_R$. Numeral 6 shows a change-over switch, the fixed terminal CAL of which is connected to the cathode of the detecting diode 41 of the traveling wave detector circuit 4. The fixed terminal SWR of the change-over switch 6, on the other hand, is connected to the cathode of the detecting diode 51 of the reflected wave detector circuit 5. The movable terminal of the switch 6 is grounded through a variable resistor 7 and a standing wave ratio indication meter 8. The cathode of the detecting diode 41 is grounded through a capacitor 42, and the anode thereof is connected to the traveling wave detecting terminal of the traveling wave detecting conductor section 32 of the coupler 3. The cathode of the detecting diode 51 is grounded through a capacitor 52, and the anode thereof is connected to the reflected wave detecting terminal of the reflected wave detecting conductor section 33 of the coupler 3.

In order to detect the standing wave ratio (SWR) in this circuit, first, the switch 6 is closed on CAL side so that the traveling wave detection DC voltage $V_F$ of the traveling wave detector circuit 4 is indicated on the meter 8. Next, the variable resistor 7 is adjusted in such a manner that the pointer of the meter 8 is positioned at CAL (calibration) mark on the scale plate (not shown) of the meter. The switch 6 is turned to the fixed terminal SWR, thus indicating the reflected wave detection DC voltage $V_R$ of the reflected wave detector circuit 5 on the meter 8. In this way, the ratio between the voltages $V_F$ and $V_R$, i.e., the standing wave ratio $V_R/V_F$ is detected. The indication on the meter 8 represents the value coresponding to the ratio between the traveling wave and the reflected wave. Therefore, if the standing wave ratio is calibrated on the meter 8, an indication on the meter 8 shows a standing wave ratio.

In this type of conventional circuit, however, the change-over of the switch 6 and the adjustment of the variable resistor 7, i.e., CAL adjustment are required each time of detection of the standing wave ratio, thus very much complicating the operation thereof.

SUMMARY OF THE INVENTION

An object of the present invention is to provide a standing wave ratio detecting apparatus capable of detecting the standing wave ratio automatically without the need of the CAL adjustment.

In order to achieve the above-mentioned object, according to the present invention, there is provided a standing wave ratio detecting apparatus comprising means for comparing the amplitude of a traveling wave detection signal with the amplitude of a sawtooth wave or a triangular wave signal proportional to the traveling wave detection signal, the comparing means producing a pulse signal when the amplitude of the sawtooth wave signal is larger than that of the reflected wave signal, means controlled by the pulse signal produced from the comparing means and producing the sawtooth wave signal or triangular wave signal, means for comparing the amplitude of the sawtooth wave or triangular wave signal with that of the reflected wave detection signal, the comparing means producing a pulse signal having a duty cycle substantially equal to the ratio between the amplitude of the reflected wave signal and that of the traveling wave signal when the amplitude of the sawtooth wave or triangular wave signal is smaller or larger than the amplitude of the reflected wave detection signal in a high output state, and a meter device for averaging out the pulse signal and indicating the average value of the pulse signal.

DESCRIPTION OF THE PREFERRED EMBODIMENTS

Figure 1:
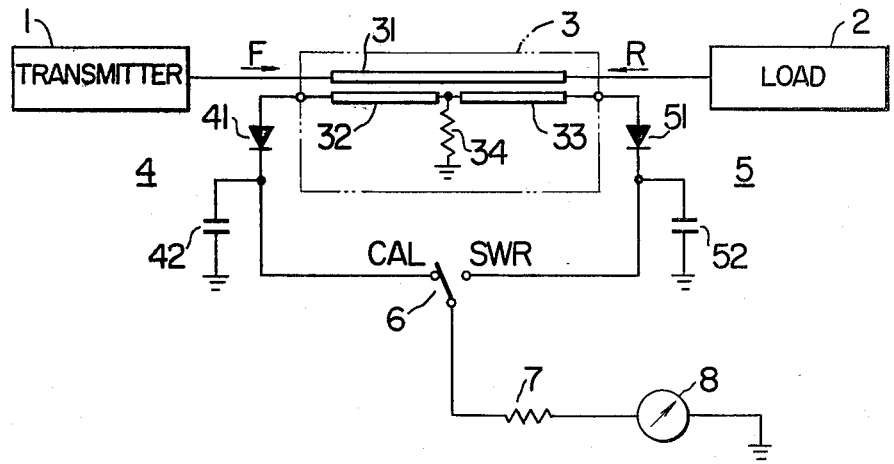
FIG. 1 is a circuit diagram showing a conventional standing wave ratio detecting apparatus.
Figure 2:
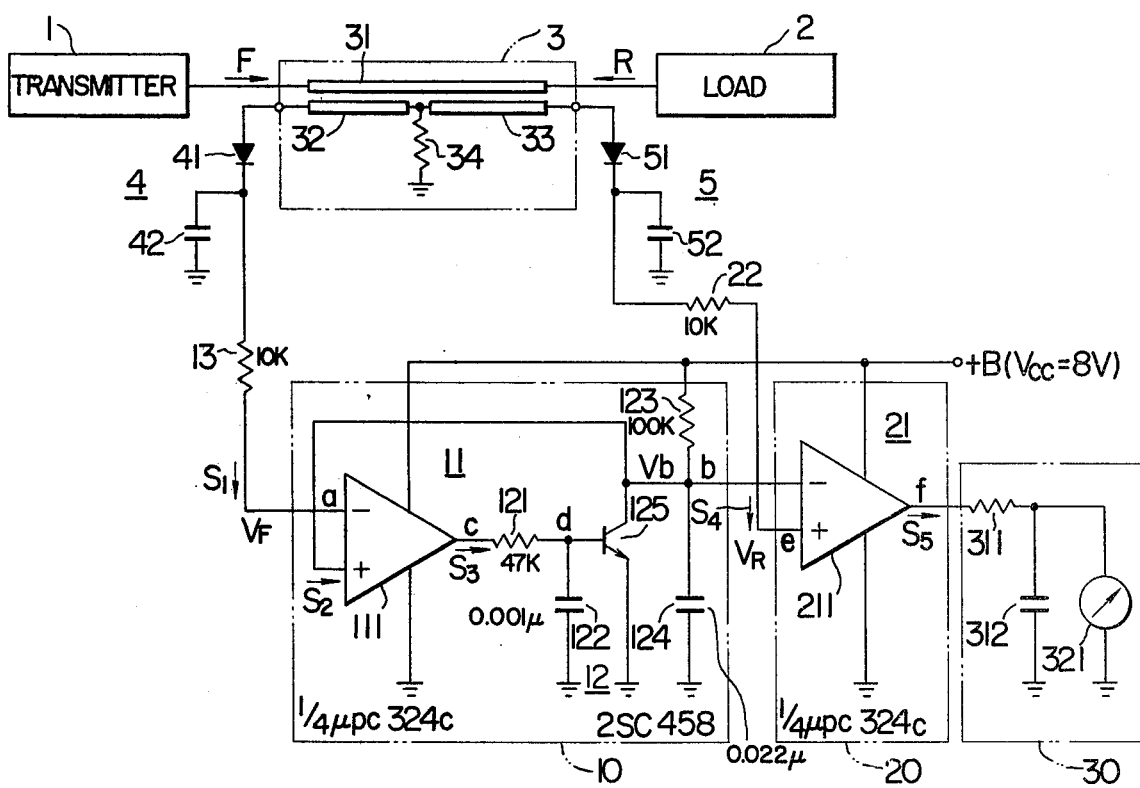
FIG. 2 is a circuit diagram showing an embodiment of the standing wave ratio detecting apparatus according to the present invention.
Figure 3:
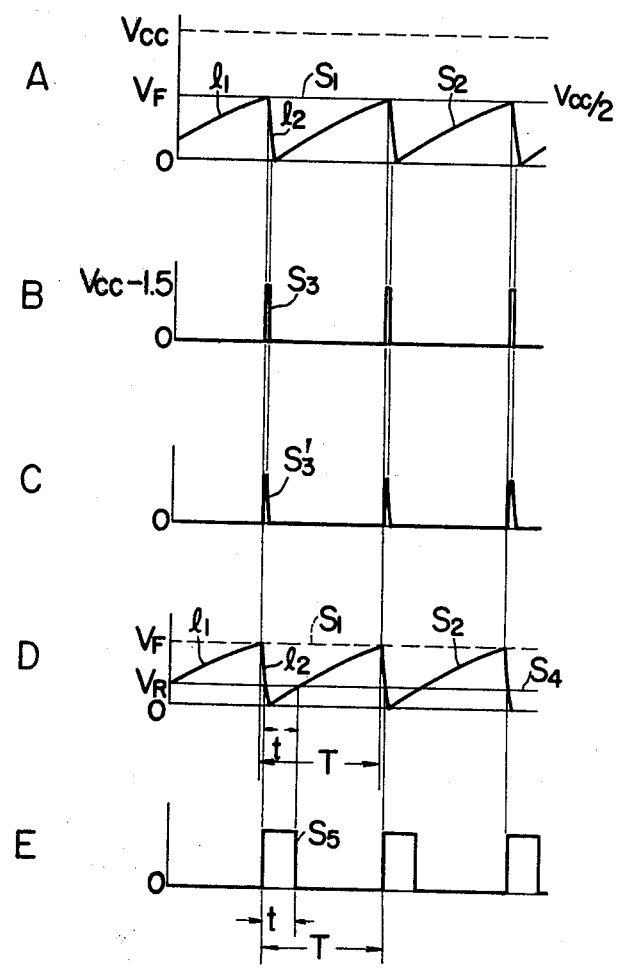
FIG. 3 is a signal waveform diagram for explaining the circuit of FIG. 2.

The present invention will be described below with reference to the drawings. FIGS. 2 and 3 show a circuit diagram of an embodiment of the present invention, and signal waveforms at the essential parts of the circuit of FIG. 3, respectively. In FIG. 2, like component elements as those in FIG. 1 are denoted by like reference numerals and will not be described in detail. In FIG. 2, numeral 10 shows means for generating a reference signal, such as a sawtooth wave signal, proportional to the amplitude of the traveling wave. The means 10 is connected to the traveling wave detector circuit 4 and includes a sawtooth wave signal generator circuit 12 described later and a comparator circuit 11 for comparing the traveling wave detection signal $S_1$ produced from the traveling wave detector circuit 4 (DC voltage $V_F$) with the sawtooth wave signal $S_2$ (sawtooth wave voltage $V_b$) produced from the sawtooth wave signal generator circuit 12. (See A of FIG. 3) When $S_2$ is larger than $S_1$, a pulse signal $S_3$ as shown in B of FIG. 3 is produced from the comparator circuit 11. The comparator circuit 11 includes, for example, an operational amplifier 111, $\mu$pc 324c made by Nippon Electric Co., Ltd. The negative phase input terminal (−) of the operational amplifier 111 is connected to the cathode of the detecting diode 41 of the traveling wave detector circuit 4 through a resistor 13, while the positive phase input terminal (+) thereof is connected to the output point b of the sawtooth wave signal generator circuit 12. The operational amplifier 111 compares, in the manner well known, the traveling wave detected DC voltage $V_F$ produced from the traveling wave detector circuit 4 with the sawtooth wave voltage $V_b$ produced from the sawtooth wave signal generator circuit 12. Take 4 V as the traveling wave detection DC voltage $V_F$ and $10^5$ as the voltage gain of the operational amplifier 111, for instance. When the sawtooth wave voltage $V_b$ is 3.9999 V (=4 V−0.0001 V), the level of the output point c of the operational amplifier 111 is clamped at a low state ($\simeq$0 V). When $V_b$ is 4.0001 V (=4 V+0.0001 V), on the other hand, the level of the output point c of the operational amplifier 111 is clamped at a high state ($\simeq V_{cc}$−1.5 V), so that the operational amplifier 111 produces a pulse signal $S_3$ as shown by B of FIG. 3 at the output point c. $V_{cc}$ shows a source voltage of the power supply +B, and 1.5 V represents a voltage value limited by the characteristics, i.e., the output voltage range of the operational amplifier 111.

The sawtooth wave signal generator circuit 12 is connected to the comparator circuit 11 and controlled by the pulse output signal $S_3$ produced from the comparator circuit 11, thereby producing a sawtooth wave voltage $V_b$ as shown by A of FIG. 3 proportional to the traveling wave signal F. The sawtooth wave signal generator circuit 12 is connected to the output point c of the operational amplifier 111, and includes a delay circuit having a resistor 121 and a capacitor 122 having a function to generate a delayed pulse signal $S_3'$ as shown by C of FIG. 3, a time constant circuit having a resistor 123 and a capacitor 124 connected in series between the power supply +B and the ground, and a switching transistor 125. The base of the transistor 125 is connected to the output point c of the operational amplifier 111 through the resistor 121 on the one hand and grounded through the capacitor 122 on the other hand. The emitter of the transistor 125 is directly grounded, while the collector thereof is connected to a junction point b of the resistor 123 and the capacitor 124 of the time constant circuit on the one hand and to the positive phase input terminal (+) of the operational amplifier 111 on the other hand. The pulse $S_3$ as shown by B of FIG. 3 appears at the output point c of the operational amplifier 111, while the pulse signal $S_3'$ as shown by C of FIG. 3 appears at the junction point d of the resistor 121 and the capacitor 122. When this pulse signal is applied to the transistor 125, the transistor 125 is biased in the forward direction by the input pulse and turned on. The charge in the capacitor 124 is then discharged through the collector-emitter of the transistor 125. As a result, the voltage $V_b$ at the junction point b of the resistor 123 and the capacitor 124 drops at the time constant $T = r_{125} \cdot C_{124}$ due to the resistance value $r_{125}$ between the collector and emitter of the transistor 125 and the capacitance $C_{124}$ of the capacitor 124. When this voltage drops to a level lower than the traveling wave detection DC voltage $V_F$, i.e., 4 V, the level at the output point c of the operational amplifier 111 is changed to low state in the manner mentioned above, so that no pulse signal is produced at the output point c, thus turning off the transistor 125. In response to the turning off of the transistor 125, the voltage $V_{cc}$ of the power supply +B is applied via the resistor 123 to the capacitor 124, thus charging the capacitor 124. The voltage at the junction point b of the resistor 123 and the capacitor 124 rises at the time constant $T = R_{123} \cdot C_{124}$ due to the resistor 123 ($R_{123}$) and the capacitor 124 ($C_{124}$). When this voltage $V_b$ increases to a level of 4.0001 V slightly higher than the traveling wave voltage $V_F$ (4 V), the level of the output point c of the operational amplifier 111 changes from the low to the high state, thus turning on the transistor 125 again. This operation is subsequently repeated, whereby the voltage $V_b$ at the output point b takes the sawtooth form as shown in A or D of FIG. 3.

Numeral 20 shows means for generating a pulse signal $S_5$ having a duty cycle substantially equal to the ratio of the reflected wave detection signal $S_4$ (DC voltage $V_R$) of the reflected wave detector circuit 5 to the traveling wave detection signal $S_1$ (DC voltage $V_F$) of the traveling wave detector circuit 4. The means 20 includes a comparator circuit 21 connected to the output of the reflected wave detector circuit 5 and the sawtooth wave signal generator means 10. The comparator circuit 21 compares the reflected wave detection signal $S_4$ (DC voltage $V_F$) produced from the reflected wave detector circuit 5 with the sawtooth wave signal $S_2$ (sawtooth wave voltage $V_b$) produced from the sawtooth wave signal generator means 10, and produces the pulse signal $S_5$ as shown by E of FIG. 3 when signal $S_2$ is smaller than signal $S_4$. The comparator circuit 21 comprises, for instance, the operational amplifier 211, $\mu$pc 324c of Nippon Electric Co., Ltd. The negative phase input terminal (−) of the operational amplifier 211 is connected to the junction point b of the sawtooth wave signal generator means 10, while the positive phase input terminal (+) thereof is connected to the cathode of the detection diode 51 of the reflected wave signal detector circuit 5 via the resistor 22. The operational amplifier 211 compares, in a well known manner, the sawtooth wave voltage $V_b$ produced from the sawtooth wave signal generator means 10 with the reflected wave detected DC voltage $V_R$ produced from the reflected wave detector circuit 5. When the voltage $V_b$ is smaller than $V_R$, the output of the operational amplifier 211 takes a high state; while when the voltage $V_b$ is higher than $V_R$, the output of the operational amplifier 211 assumes a low state, thus producing the pulse signal $S_5$ (pulse output voltage $V_f$) at the output point f of the operational amplifier 211 as shown by E of FIG. 3. The relation between $V_b$ and $V_R$ is dependent on the detection polarity of the traveling and reflected wave detector circuits 4 and 5. In other words, by reversing the connection of the diodes 41 and 51 to that shown in FIG. 2, the relation between $V_b$ and $V_R$ is reversed. The duty cycle of the pulse signal $S_5$, i.e., the ratio of the on period of the pulse signal $S_5$ (high level period) to the period T of the sawtooth wave signal $S_2$ (see D and E of FIG. 3) is expressed as $$\frac{t}{T} \doteq \frac{V_R}{V_F} = \frac{\text{Reflected wave level}}{\text{Traveling wave level}} \quad (\%)$$

Assuming that the sawtooth portion $l_1$ of the sawtooth wave signal $S_2$ is exactly linear, the relation between $t/T$ and $V_R/V_F$ is $t/T=V_R/V_F$. For simplicity of the subsequent description, the duty cycle $t/T$ is assumed to be equal to $V_R/V_F$.

In short, the pulse signal $S_5$ having a duty cycle substantially equal to the level ratio $V_R/V_F$ is produced at the output of the operational amplifier 211, where $V_F$ is a sawtooth wave voltage (amplitude) proportional to the traveling wave level, and $V_R$ the reflected wave detected DC voltage proportional to the reflected wave level.

As well known, the voltage standing wave ratio VSWR is expressed as $$VSWR = \frac{V_F + V_R}{V_F - V_R} = \frac{1 + V_R/V_F}{1 - V_R/V_F} = f(x)$$

which is a function of $x=V_R/V_F$.

Numeral 30 shows a meter device connected to the output of the operational amplifier 211 of the means 20 for indicating the voltage standing wave ratio in response to the pulse signal $S_5$ produced at the output point f of the amplifier 211. The meter device 30 comprises a smoothing circuit including a resistor 311 and a capacitor 312 for taking the average of the output signal $S_5$ ($V_f$) of the operational amplifier 211, and a meter 321 for indicating the average voltage value. The meter 321 has a scale converted into the standing wave ratio. In other words, by calibrating the meter 321 in the manner as shown in FIG. 4, for instance, the voltage standing wave ratio VSWR is capable of being indicated.

Figure 4:
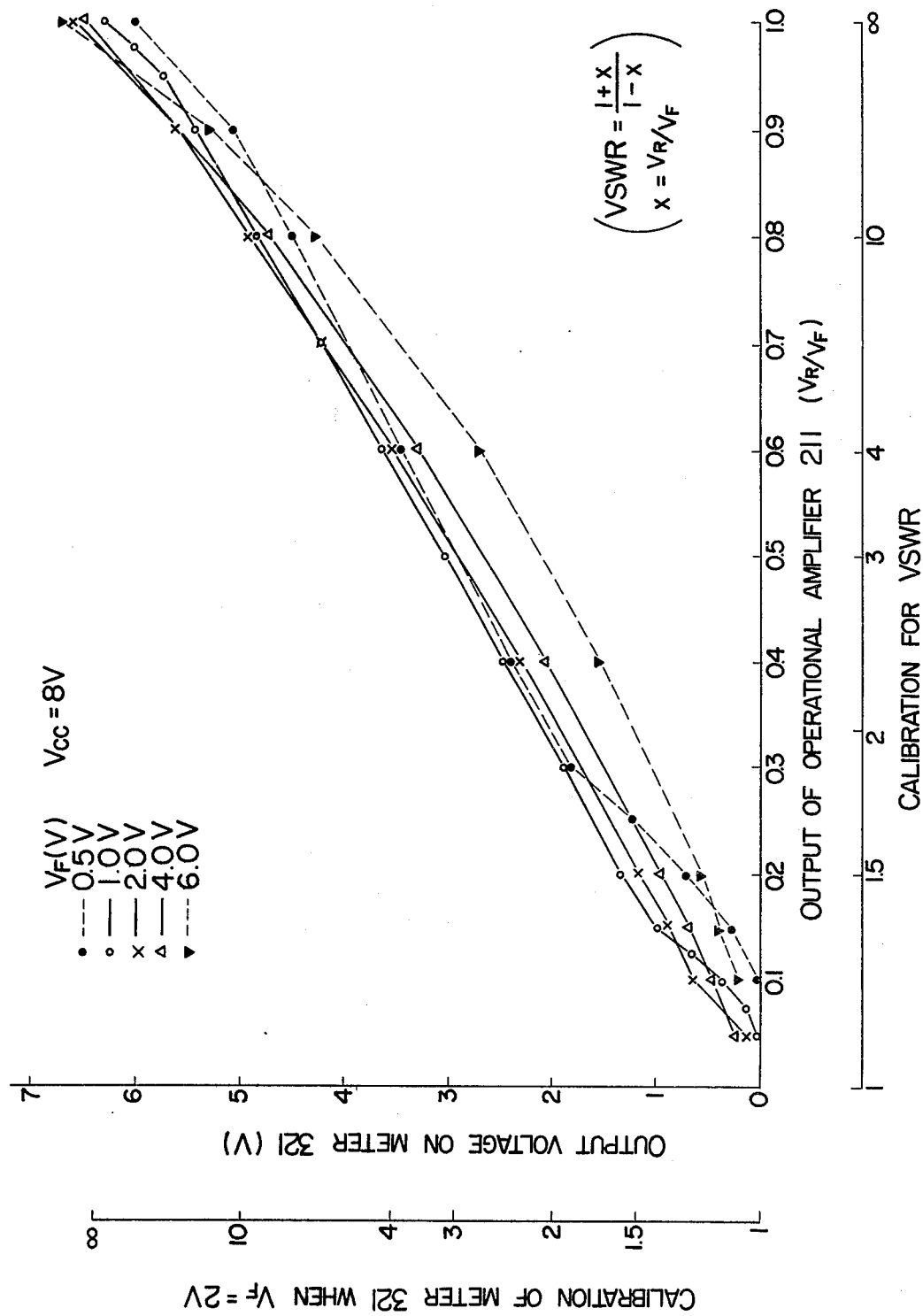
FIG. 4 is a characteristics diagram for explaining the present invention.

FIG. 4 is a characteristics diagram showing the relation between the output voltage of the meter 321 and the output of the operational amplifier 211 ($V_R/V_F$) at the traveling wave detected DC voltage $V_F$. It will be seen from this characteristics diagram that if the traveling wave detected DC voltage $V_F$ is set below 4 V, i.e., below one half of the source voltage $V_{cc}$ (=8 V), the variation thereof is minimized.

According to the embodiment under consideration, it is possible to produce a pulse signal having a duty cycle substantially equal to the ratio of the reflected wave amplitude to the traveling wave amplitude, so that a superior standing wave ratio detecting apparatus capable of detecting the standing wave ratio automatically is obtained without the need of a CAL adjustment unlike the prior art.

In this embodiment, the sawtooth wave signal generator means 10 is used as the means for generating a reference signal proportional to the amplitude of the traveling wave F. This signal generator means 10, however, may be replaced by a triangular wave signal generator means with equal effect. In short, the reference signal proportional to the amplitude of the traveling wave F according to this invention indicates a wave having a positive going linear ramp $l_1$ and a negative going linear ramp $l_2$, i.e., a sawtooth or triangular wave signal.

Figure 5:
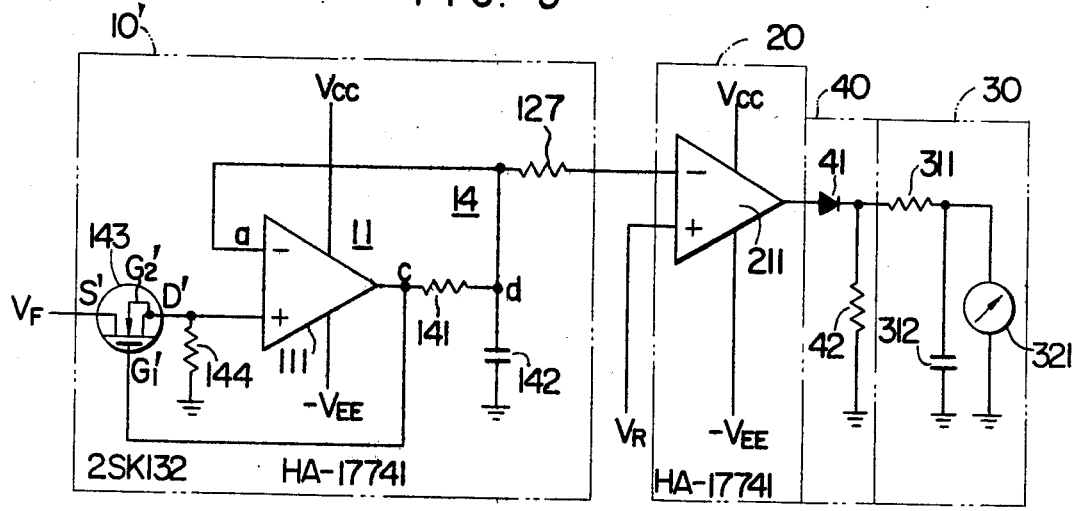
FIG. 5 is a circuit diagram showing another embodiment of the standing wave ratio detecting apparatus according to the present invention.
Figure 6:
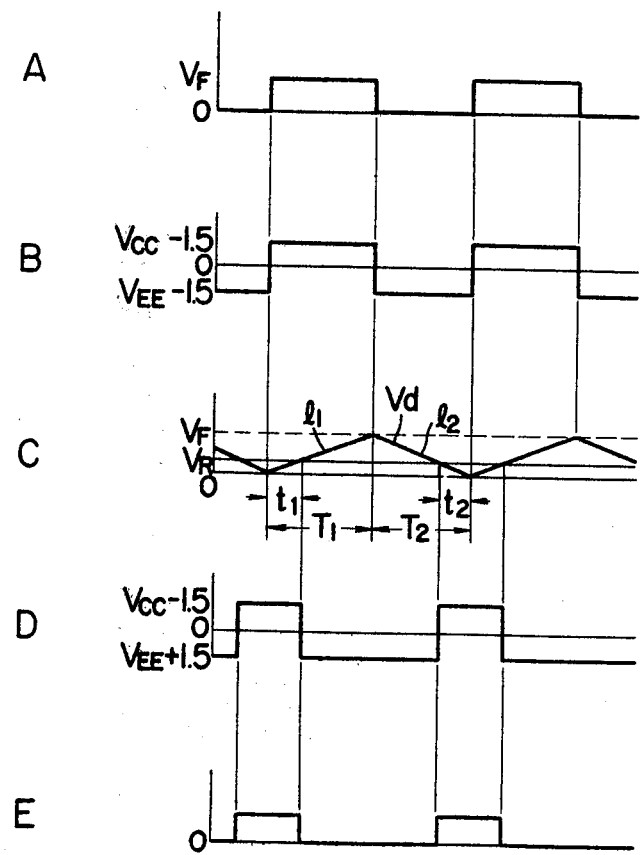
FIG. 6 is a characteristics diagram for explaining the operation of the circuit of FIG. 5.

FIG. 5 shows a circuit diagram of another embodiment of the present invention using such a triangular wave signal generator means, and FIG. 6 signal waveforms produced at the essential parts of the same circuit. In FIG. 5, like component elements as in FIG. 3 are denoted by like reference numerals and will not be described again. In FIG. 5, numeral 10' shows a triangular wave signal generator means comprising an operational amplifier 111 making up a comparator circuit 11, a resistor 141 and a capacitor 142 making up a charge-discharge circuit, and a gate circuit including a MOS-FET 143 and a resistor 144. The positive phase input terminal (+) of the operational amplifier 111 is connected to the drain D of MOS-FET 143, and the negative phase input terminal (−) of the means 20 is connected via resistor 127 to the negative phase input terminal (−) of the operational amplifier 211 of the means 20. The output terminal of the operational amplifier 111 is connected through the resistor 141 to the negative phase input terminal (−) of the amplifier 111 on the one hand and grounded through the resistor 141 and capacitor 142 on the other hand. The output terminal of the amplifier 111 is connected to the gate $G_1'$ of the FET 143. The source S' of the FET 143 is connected to the traveling wave detector circuit (not shown) while the drain thereof is grounded through the resistor 144 on the one hand and connected to the gate (the substrate) $G_2'$ on the other hand.

Assume that the voltage $V_d$ at the junction point d of the resistor 141 and the capacitor 142 is 0 V and that the level at the output point c of the operational amplifier 111 is high (about 8.5 V). The high-level signal is applied to the gate $G_1'$ of the FET 143, in response to which the FET 143 is turned on at such a high level. In response to the turning on of the FET 143, the detection DC voltage $V_F$ from the traveling wave detector circuit is applied to the positive phase input terminal (+) of the amplifier 111 via FET 143. The amplifier 111 compares this input voltage $V_F$ with the voltage $V_d$ at point d in the well-known manner. Since $V_F$ is higher than $V_d$ (=0), the high level is maintained. (See B of FIG. 6) This high level is applied to the capacitor 142 through the resistor 141, thus increasing the voltage $V_d$ at point d. (See C of FIG. 6.) When the voltage $V_d$ exceeds the traveling wave DC voltage $V_F$, the level at the output point c of the amplifier 111 changes from high to low state (about −8.5 V). When the level at the output point c is reduced to low state, FET 143 is turned off. As a result, application of the traveling wave detected DC voltage $V_F$ to the amplifier 111 is cut off, so that the voltage at the positive phase input terminal (+) of the amplifier 111 is reduced to 0 V. The reference voltages $V_F$ and $V_d$ of the amplifier 111 has the relation $V_F < V_d$ at this moment, thus maintaining the output point c of the amplifier 111 at low level. (See B of FIG. 6.) When the output point c is at low level, the voltage $V_d$ at point d drops by discharging through the resistor 141. (See C of FIG. 6.) When the voltage $V_d$ is decreased below 0 V, the level at the output point c of the amplifier 111 changes from low to high state. Subsequently, the above-mentioned operation is repeated.

The operational amplifier 211 compares the voltage $V_d$ produced at the point d with the reflected wave detected DC voltage $V_R$, in the well-known manner (See C of FIG. 6) and produces a pulse voltage as shown by D of FIG. 6. Numeral 40 shows a circuit for applying to the meter device 30 only a positive component of the output voltage of the operational amplifier 211 as shown by E of FIG. 6. The circuit 40 comprises a diode 41 inserted as shown between the output of the operational amplifier 211 and the input of the meter device 30. This circuit 40 is required in the case where a double-power supply system ($V_{cc}$, $-V_{EE}$) is employed as the operational amplifiers 111 and 211, but is not required in the case of a single-power system.

According to this circuit configuration, the same advantage as that of the first embodiment mentioned above is attained.

I claim:

1. An apparatus for measuring the standing wave ratio of a line, comprising a traveling wave detector circuit coupled to said line for producing a traveling wave detection signal by detection of the traveling wave on the line, and a reflected wave detector circuit coupled to said line for producing a reflected wave detection signal by detection of the reflected wave on said line; wherein the apparatus further comprises first means connected to said traveling wave detector circuit for generating a reference signal to be compared with said traveling wave detection signal and with said reflected wave detection signal, said first means including comparing means for comparing said traveling wave detection signal and said reference signal and for producing a pulse signal when one of the compared signals is larger than the other, reference signal generating means connected with said comparing means for generating said reference signal upon reception of said pulse signal from said comparing means and means for feeding the output of said reference signal generating means back to the input to said comparing means, said reference signal having a waveform consisting of a positive going linear ramp and a negative going linear ramp and having a maximum value proportional to the amplitude of said traveling wave, second means connected to said first means and said reflected wave detector circuit for comparing the amplitude of the reference signal produced from said first means with the amplitude of the reflected wave detection signal produced from said reflected wave detector circuit, said second means generating a pulse signal having a duty cycle substantially equal to the ratio of the amplitude of said reflected wave signal to the amplitude of the traveling signal, and third means connected to said second means for taking the average of said pulse signal produced from said second means, said third means indicating a standing wave ratio in response to said output of average value.

2. An apparatus for detecting the standing wave ratio according to claim 1, in which:

said reference signal generating means is provided as sawtooth wave generator means including a time constant circuit having a capacitor and a resistor connected with each other and a switching element connected to the junction point of the resistor and the capacitor of said time constant circuit, and said comparing means includes a first operational amplifier having its input terminals connected to the output of said traveling wave detector circuit and to the junction point of said switching element, the resistor and capacitor of said time constant circuit in said sawtooth wave generator means and having its output terminal connected to said switching element, said first operational amplifier comparing the traveling wave detected DC voltage produced from said traveling wave detector circuit with the sawtooth wave voltage produced from said sawtooth wave generator means for producing a pulse voltage when said sawtooth wave voltage is higher than said traveling wave detected DC voltage;

said second means comprises a second operational amplifier having its input terminals connected to the output of said reflected wave detector circuit and to the junction point of the resistor and the capacitor of said time constant circuit in said sawtooth wave generator means and having its output terminal connected to said third means, said second operational amplifier comparing the reflected wave detected DC voltage produced from said reflected wave detector circuit with the sawtooth wave voltage produced from said sawtooth wave generator means for producing a pulse voltage having a duty cycle substantially equal to the ratio of the amplitude of said reflected wave signal to the amplitude of said traveling wave signal; and said third means comprises a smoothing circuit connected to the output terminal of said second operational amplifier for taking the average of the output pulse voltage of said second operational amplifier, and a meter connected to said smoothing circuit for indicating a standing wave ratio on the basis of the output of average value produced from said smoothing circuit.

3. An apparatus for detecting the standing wave ratio according to claim 1, in which:

said reference signal generating means is a triangular wave generator means including a charge-discharge circuit having a resistor and a capacitor connected in series to each other and a gate circuit connected to the output of said traveling wave detector circuit, and said comparing means includes a first operational amplifier having its input terminals connected to the output of said gate circuit and to the junction point of the resistor and capacitor said charge-discharge circuit in said triangular wave generator means and having its output terminal connected to said charge-discharge circuit, said first operational amplifier comparing the triangular wave voltage produced from said triangular wave generator means with that part of said traveling wave detected DC voltage produced from said traveling wave detector circuit which has passed said gate circuit for producing a pulse voltage when said triangular wave voltage is higher than said traveling wave detected DC voltage;

said second means comprises a second operational amplifier having its input terminals connected to the output of said reflected wave detector circuit and to the junction point of the resistor and capacitor of said charge discharge circuit in said triangular wave generator means and having its output terminal connected to said third means, said second operational amplifier comparing the reflected wave detected DC voltage produced from said reflected wave detector circuit with the triangular wave voltage produced from said triangular wave generator means, said second operational amplifier producing a pulse voltage having a duty cycle substantially equal to the ratio of the amplitude of said reflected wave signal to the amplitude of said traveling wave signal when said triangular wave voltage is lower than said reflected wave detected DC voltage; and said third means comprises a smoothing circuit connected to the output of said second operational amplifier for taking the average of the output pulse voltage of said second operational amplifier, and a meter connected to said smoothing circuit for indicating a standing wave ratio in response to the average output value of said smoothing circuit.

4. An apparatus for detecting the standing wave ratio of a line, comprising a traveling wave detector circuit coupled to said line for producing a traveling wave detection signal by detection of the traveling wave on the line, and a reflected wave detector circuit coupled to said line for producing a reflected wave detection signal by detection of the reflected wave on said line; wherein the apparatus further comprises (a) sawtooth wave generator means connected to said traveling detector circuit for generating a sawtooth wave to be compared with said traveling wave detection signal and with said reflected wave detection signal, said sawtooth wave generator means including a time constant circuit having a capacitor and a resistor connected in series between a power supply and the ground, and a switching element connected in parallel to the capacitor of said time constant circuit, (b) a first operational amplifier connected to the output of said traveling wave detector circuit and to the junction point of said switching element and the resistor and capacitor of the time constant circuit in said sawtooth wave shaping circuit, said first operational amplifier comparing the traveling wave detected DC voltage produced from said traveling wave detector circuit with the sawtooth wave voltage produced from said sawtooth wave generator means, said first operational amplifier producing a pulse voltage when said sawtooth wave voltage is higher than said traveling wave detected DC voltage, (c) a control circuit connecting the output of said amplifier to said switching element for controlling said switching element in response to the output pulse voltage of said amplifier;

(d) a second operational amplifier connected to the output of said reflected wave detector circuit and the junction point of the resistor and the capacitor of said time constant circuit in said sawtooth wave generator means, said second operational amplifier comparing the reflected wave detected DC voltage produced from said reflected wave detector circuit with the sawtooth wave voltage produced from said sawtooth wave generator means, said second operational amplifier producing a pulse voltage having a duty cycle substantially equal to the ratio of the amplitude of said reflected wave signal to the amplitude of said traveling wave signal;

(e) said third means comprises a smoothing circuit connected to the output of said second operational amplifier for taking the average of the output pulse voltage of said second operational amplifier, and (f) a meter connected to said smoothing circuit for indicating a standing wave ratio on the basis of the output of average value produced from said smoothing circuit.

5. An apparatus for detecting the standing wave ratio of a line, comprising a traveling wave detector circuit coupled to said line for producing a traveling wave detection signal by detection of the traveling wave on the line, and a reflected wave detector circuit coupled to said line for producing a reflected wave detection signal by detection of the reflected wave on said line; wherein the apparatus further comprises (a) a triangular wave generator means connected to said traveling wave detector circuit for generating a triangular wave to be compared with said traveling wave detection signal and with said reflected wave detection signal, said triangular wave generator means including a charge-discharge circuit having a resistor and a capacitor connected in series to each other, and a gate circuit connected to the output of said traveling wave detector circuit.

(b) a first operational amplifier connected to the output of said gate circuit and to the junction point of the resistor and capacitor of said charge-discharge circuit in said triangular wave shaping circuit, said first operational amplifier comparing the triangular wave voltage produced from said triangular wave generator means with that part of said traveling wave detected DC voltage produced from said traveling wave detector circuit which has passed said gate circuit, said first operational amplifier producing a pulse voltage when said triangular wave voltage is higher than said traveling wave detected DC voltage, (c) a control circuit connecting the output of said first operational amplifier to the resistor of said charge-discharge circuit and to the gate input of said gate circuit, said control circuit controlling said gate circuit in response to the output pulse voltage of said first operational amplifier;

(d) a second operational amplifier connected to the output of said reflected wave detector circuit and to the junction point of the resistor and capacitor of said charge-discharge circuit in said triangular wave generator means, said second operational amplifier comparing the reflected wave detected DC voltage produced from said reflected wave detector circuit with the triangular wave voltage produced from said triangular wave generator means, said second operational amplifier producing a pulse voltage having a duty cycle substantially equal to the ratio of the amplitude of said reflected wave signal to the amplitude of said traveling wave signal when said triangular wave voltage is lower than said reflected wave detected DC voltage;

(e) a smoothing circuit connected to the output of said second operational amplifier for taking the average of the output pulse voltage of said second operational amplifier, and (f) a meter connected to said smoothing circuit for indicating a standing wave ratio in response to the average output value of said smoothing circuit.

* * * * *